United States Patent
Tan

(10) Patent No.: US 9,024,440 B2
(45) Date of Patent: May 5, 2015

(54) FLIP-CHIP PACKAGE STRUCTURE AND METHOD FOR AN INTEGRATED SWITCHING POWER SUPPLY

(71) Applicant: Silergy Semiconductor Technology (Hangzhou) Ltd, Hangzhou, ZheJiang Province (CN)

(72) Inventor: Xiaochun Tan, Hangzhou (CN)

(73) Assignee: Silergy Semiconductor Technology (Hangzhou) Ltd, Hangzhou (CN)

( * ) Notice: Subject to any disclaimer, the term of this patent is extended or adjusted under 35 U.S.C. 154(b) by 100 days.

(21) Appl. No.: 14/018,206

(22) Filed: Sep. 4, 2013

(65) Prior Publication Data

US 2014/0070385 A1   Mar. 13, 2014

(30) Foreign Application Priority Data

Sep. 12, 2012   (CN) .......................... 2012 1 0335201

(51) Int. Cl.
*H01L 23/48*   (2006.01)
*H01L 23/00*   (2006.01)
(Continued)

(52) U.S. Cl.
CPC .............. *H01L 24/73* (2013.01); *H01L 24/91* (2013.01); *H01L 2924/10253* (2013.01); *H01L 2224/14131* (2013.01); *H01L 2224/14134* (2013.01); *H01L 24/05* (2013.01); *H01L 24/11* (2013.01); *H01L 24/13* (2013.01); *H01L 24/14* (2013.01); *H01L 24/16* (2013.01); *H01L 24/81* (2013.01); *H03K 17/56* (2013.01); *H01L 2224/0401* (2013.01); *H01L 2224/11424* (2013.01); *H01L 2224/11464* (2013.01); *H01L 2224/13082* (2013.01); *H01L 2224/131* (2013.01); *H01L 2224/13111* (2013.01); *H01L 2224/13144* (2013.01); *H01L 2224/13147* (2013.01); *H01L 2224/13155* (2013.01); *H01L 2224/16245* (2013.01); *H01L 2224/81191* (2013.01);
(Continued)

(58) Field of Classification Search
CPC ..... H01L 24/73; H01L 23/5286; H01L 24/91; H01L 2224/81191; H01L 2224/16245; H01L 2224/13155; H01L 2224/13147; H01L 2224/131; H01L 2224/0401
USPC .......... 257/666, 738, 676, 737, 780, E23.001, 257/E23.169, E21.506, E21.59, E23.031, 257/E33.066; 438/111, 123, 611, 613, 598, 438/618
See application file for complete search history.

(56) References Cited

U.S. PATENT DOCUMENTS 6,130,546 A * 10/2000 Azizi ........................ 324/755.04
6,800,947 B2 * 10/2004 Sathe ............................ 257/780
(Continued)

*Primary Examiner* — Cuong Q Nguyen
*Assistant Examiner* — Yosef Gebreyesus
(74) *Attorney, Agent, or Firm* — Michael C. Stephens, Jr.

(57) ABSTRACT

Disclosed are flip-chip package structures and methods for an integrated switching power supply. In one embodiment, a flip-chip package structure can include: (i) a die with an integrated switching power supply, where a first surface of the die includes first bumps with different polarities; (ii) a redistribution layer including redistribution layer units, each having a first surface to connect bumps with a same polarity from the first bumps, the redistribution layer having a second surface including second bumps to redistribute polarities; (iii) a lead frame having pins, where a first surface of the lead frame can connect bumps with a same polarity from the second bumps; and (iv) a flip-chip package configured to package the die, the redistribution layer, the first and second bumps, and the lead frame, where a second surface of the lead frame provides electrical connectivity between the integrated switching power supply and a PCB.

19 Claims, 13 Drawing Sheets

(51) Int. Cl.
*H03K 17/56* (2006.01)
*H01L 23/495* (2006.01)
*H01L 23/528* (2006.01)
*H02M 3/158* (2006.01)
*H05K 3/34* (2006.01)

(52) U.S. Cl.
CPC .............. *H01L 2224/14515* (2013.01); *H01L 2224/14177* (2013.01); *H01L 23/49562* (2013.01); *H01L 23/5286* (2013.01); *H02M 3/1588* (2013.01); *H05K 3/3436* (2013.01); *H05K 2201/10515* (2013.01); *H05K 2201/10962* (2013.01); *H01L 2924/13091* (2013.01); *Y02B 70/1466* (2013.01)

(56) References Cited

U.S. PATENT DOCUMENTS

| | | | |
|---|---|---|---|
| 6,875,921 B1* | 4/2005 | Conn | 174/534 |
| 8,062,968 B1* | 11/2011 | Conn | 438/612 |
| 2004/0113253 A1* | 6/2004 | Karnezos | 257/686 |
| 2005/0062156 A1* | 3/2005 | Alter et al. | 257/738 |
| 2005/0133929 A1* | 6/2005 | Howard | 257/774 |
| 2008/0035959 A1* | 2/2008 | Jiang | 257/204 |
| 2008/0110665 A1* | 5/2008 | Satoh et al. | 174/254 |
| 2008/0179735 A1* | 7/2008 | Urakawa | 257/691 |
| 2011/0241125 A1* | 10/2011 | Rader et al. | 257/401 |
| 2012/0146209 A1* | 6/2012 | Hu et al. | 257/692 |
| 2013/0075893 A1* | 3/2013 | Herbsommer et al. | 257/737 |

\* cited by examiner

FLIP-CHIP PACKAGE STRUCTURE AND METHOD FOR AN INTEGRATED SWITCHING POWER SUPPLY

RELATED APPLICATIONS

This application claims the benefit of Chinese Patent Application No. 201210335201.8, filed on Sep. 12, 2012, which is incorporated herein by reference in its entirety.

FIELD OF THE INVENTION

The present invention relates semiconductor devices, and more particularly to flip-chip package structures and methods for an integrated switching power supply.

BACKGROUND

Switching power supplies, such as DC-to-DC voltage converters, may be used to provide stable voltage sources for various electronic systems. Efficient DC-to-DC converters may be particularly useful for battery management in low power devices (e.g., laptop notebooks, cellular phones, etc.). A switching voltage regulator can generate an output voltage by converting an input DC voltage into a high frequency chopped voltage, and then filtering the high frequency chopped voltage to generate the output DC voltage. Specifically, a switching regulator can include a switch for alternately coupling and decoupling an input DC voltage source (e.g., a battery) to a load (e.g., an integrated circuit [IC]). An output filter, typically including an inductor and a capacitor, may be coupled between the chopped input voltage and the load to filter the output, and thus provide the output DC voltage. A controller (e.g., a pulse-width modulator [PWM], a pulse-frequency modulator [PFM], etc.) can control the switch to maintain a substantially constant output DC voltage.

SUMMARY

In one embodiment, a flip-chip package structure can include: (i) a die having an integrated switching power supply thereon, where a first surface of the die includes a plurality of first bumps having at least two polarities; (ii) a redistribution layer including a plurality of redistribution layer units, each redistribution layer unit having a first surface configured to connect bumps with a same polarity from among the plurality of first bumps, the redistribution layer having a second surface including a plurality of second bumps configured to redistribute polarities; (iii) a lead frame having a plurality of pins, where a first surface of the lead frame is configured to connect bumps with a same polarity from among the plurality of second bumps; and (iv) a flip-chip package configured to package the die, the redistribution layer, the pluralities of first and second bumps, and the lead frame, where a second surface of the lead frame is configured to provide electrical connectivity between the integrated switching power supply and a printed-circuit board (PCB).

In one embodiment, a flip-chip packaging method can include: (i) providing a die having an integrated switching power supply thereon, where a first surface of the die includes a plurality of first bumps having at least two polarities; (ii) laying a redistribution layer including a plurality of redistribution layer units on the die, where a first surface of the redistribution layer units is configured to connect bumps with a same polarity from among the plurality of first bumps, and where a second surface of the redistribution layer units comprises a plurality of second bumps configured to redistribute polarities; (iii) laying a lead frame having a plurality of pins on the redistribution layer, where a first surface of the lead frame is configured to connect to bumps having a same polarity from among the plurality of second bumps; and (iv) packaging the die, the pluralities of first and second bumps, and the lead frame into a flip-chip package structure, where a second surface of the lead frame is configured to provide electrical connectivity between the integrated switching power supply and a PCB.

DETAILED DESCRIPTION

Figure 1:
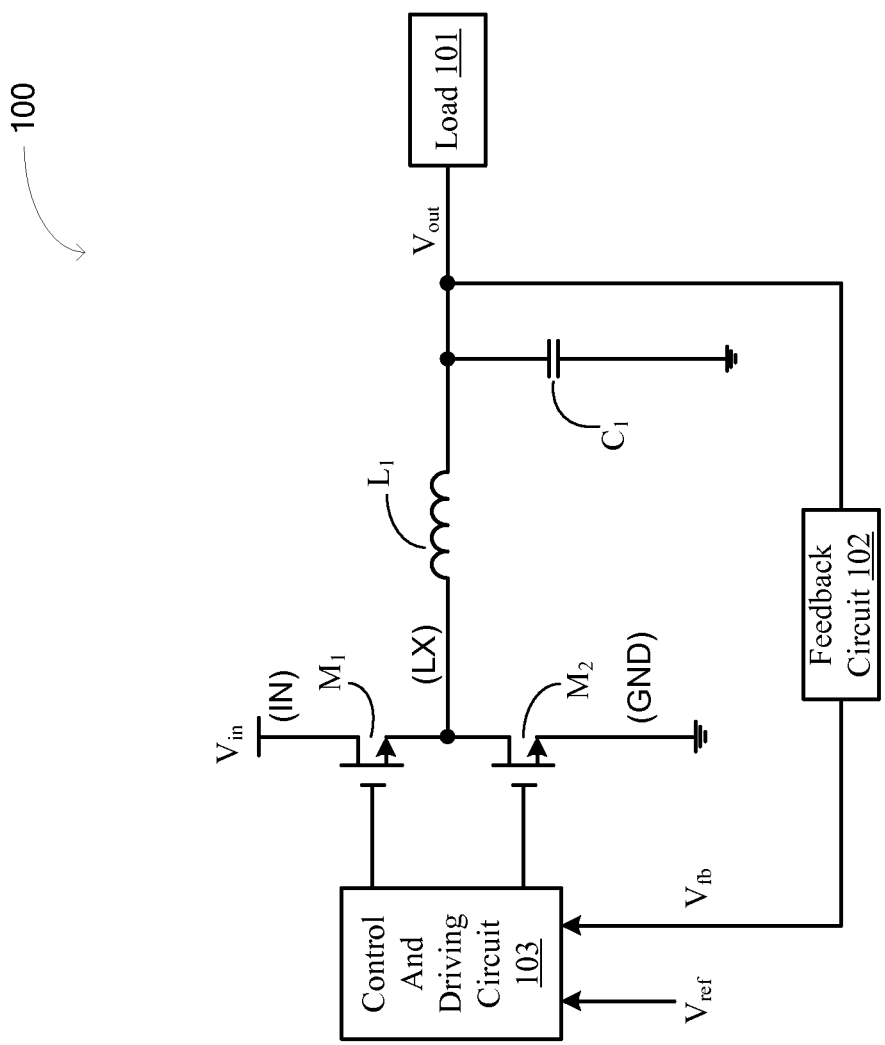
FIG. 1 is a block diagram of an example switching power supply with a buck topology.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set fourth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

An integrated circuit (IC) package structure can be utilized both to protect the die, and to achieve electrical connectivity between pads on the die and peripheral circuits. A die in the context of ICs is a small block of semiconducting material, on which a given functional circuit is fabricated. Typically, ICs are produced in large batches on a single wafer of electronic-grade silicon (EGS) or other semiconductor material (e.g., GaAs) through fabrication processes, such as photolithography. The wafer may then be cut or "diced" into many pieces, each containing one such circuit copy. Each of these pieces is called a die. The quality of the IC package containing the die can affect overall performance of a die therein. Therefore, the IC package should have strong mechanical properties, as well as good electrical and thermal properties, and chemical stability.

Different packaging schemes can be supplied for integrated switching power supplies. For example, power devices and controllers can be configured as separate elements or dies, which can then be electrically connected through internal bonding wires, and both dies can be packaged in a single package structure. Alternatively, controllers, drivers, and power devices can all be integrated into one die. Parasitic resistance and inductance can be reduced without such bonding wires between or among controllers, drivers, and power devices. Thus, as compared to discrete component solutions, larger current and higher switching frequency can be achieved through monolithically integrating a switching power supply due to reduced parasitic resistances and/or inductances.

Relatively large currents may be passed or transferred due to the characteristics of switching power supplies. Resistive power losses that may be caused by package structure, elements, and/or connectors, may be reduced and order to improve the efficiency of a switching power supply. Parasitic on resistance $R_{ds(on)}$ of power devices can also be reduced through the manufacturing process.

In particular embodiments, different electrodes on ICs can be redistributed on a lead frame through a redistribution layer (RDL) to achieve optimized electrode distribution in a flip-chip package. The area and thickness of metal layers of a printed-circuit board (PCB) and pins of a lead frame can be configured to be larger to reduce resistances of certain current conducting paths. In this way, power losses may be decreased and current carrying capability can be enhanced to improve the efficiency of the switching power supply. Furthermore, the size of the flip-chip package structure can be arranged or modulated as appropriate. Thus, the region that the power device occupies can be expanded or contracted by modulating the area of the power device. This can simplify the design of a series of products and package process to enhance the versatility of variable power devices with different rated currents.

Referring now to FIG. 1, shown is a block schematic diagram of an example switching power supply with a buck topology. Here, power device $M_1$, power device $M_2$, inductor $L_1$, and capacitor $C_1$ can form a power stage with a buck topology that is configured to convert input voltage $V_{in}$ into output voltage $V_{out}$ to drive load 101. A close-loop controlling mode can be employed in power supply 100 as shown. Feedback circuit 102 can generate feedback signal $V_{fb}$ that represents output voltage $V_{out}$. Control signals can be generated by control and driving circuit 103 based on feedback signal $V_{fb}$ and reference voltage $V_{ref}$ that represents a predetermined output voltage. In this way, the on and off operation of power devices $M_1$ and $M_2$ can be controlled (e.g., with periodic operation) to maintain output voltage $V_{out}$ as substantially constant.

The example switching power supply of FIG. 1 can be integrated into an IC in a variety of configurations. For example, power device $M_1$, power device $M_2$, and control and driving circuit 103 can be integrated as discrete dies, which can then be electrically connected to each other through bonding wires inside the package structure. While this implementation can simplify the manufacturing process, power losses introduced by parasitic resistances and/or inductances of the bonding wires may limit the efficiency of the switching power supply.

Alternatively, power device $M_1$, power device $M_2$, and control and driving circuit 103 can be integrated on a single die. In this implementation, parasitic resistances and/or inductances be decreased because no bonding wires may be utilized to achieve connectivity among the various functional elements of the monolithic switching power supply. In this way, a monolithic switching power supply can accommodate larger current densities, and may operate at a higher switching frequency.

Package structure can be utilized to achieve electrical connectivity between the die and external circuitry, and to provide mechanical and environmental protection for the die. Three pins (as shown in parentheses in FIG. 1) may generally be utilized to achieve electrical activity to the external circuit for a switching power supply IC. Such pins are input pin IN employed to receive input voltage $V_{in}$, ground pin GND employed to provide a ground potential to the IC, and output pin LX employed to output the electrical signal to drive the load via the filter circuit formed by inductor $L_1$ and capacitor $C_1$.

For example, power devices $M_1$ and $M_2$ may be configured as laterally diffused metal oxide semiconductor (LDMOS) transistors in the example switching power supply shown in FIG. 1. In this case, input pin IN can be configured as the drain of power device $M_1$ to receive input voltage $V_{in}$, ground pin GND can be configured as the source of power device $M_2$ to provide a ground potential to the IC, and output pin LX can be configured as the common node of the source of power device $M_1$ and the drain of power device $M_2$, for connection to inductor $L_1$.

A flip-chip package structure in particular embodiments can be applied to both the integration of discrete elements, and to monolithic integration of switching power supply components. In one example of integration of discrete elements, power device $M_1$, power device $M_2$, and control and driving circuit 103 can be configured as discrete dies. For example, a flip-chip package structure can include bumps for connection between a redistribution layer and the die, and between the redistribution layer and the lead frame, where the bumps are configured as pads and solder balls thereon.

In one embodiment, a flip-chip package structure can include: (i) a die having an integrated switching power supply thereon, where a first surface of the die includes a plurality of first bumps having at least two polarities; (ii) a redistribution layer including a plurality of redistribution layer units, each redistribution layer unit having a first surface configured to connect bumps with a same polarity from among the plurality of first bumps, the redistribution layer having a second surface including a plurality of second bumps configured to redistribute polarities; (iii) a lead frame having a plurality of pins, where a first surface of the lead frame is configured to connect bumps with a same polarity from among the plurality of second bumps; and (iv) a flip-chip package configured to package the die, the redistribution layer, the pluralities of first and second bumps, and the lead frame, where a second surface of the lead frame is configured to provide electrical connectivity between the integrated switching power supply and a printed-circuit board (PCB).

Figure 2:
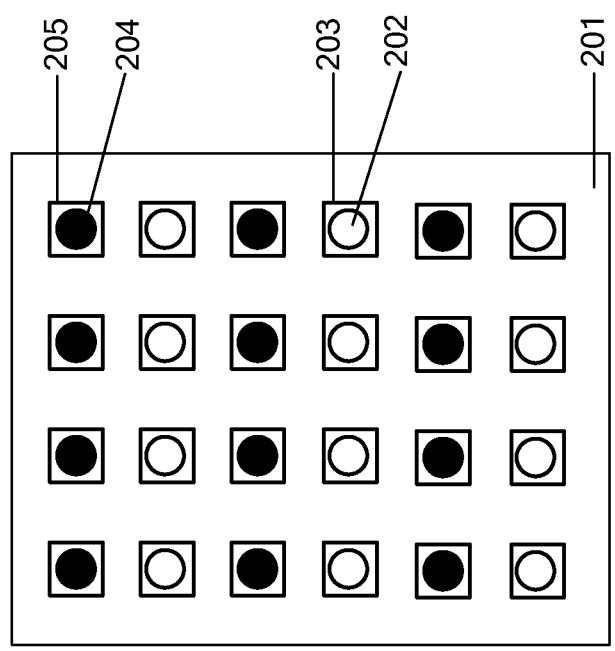
FIG. 2 shows an example distribution pattern of pads and solder balls on a power device die, in accordance with embodiments of the present invention.

Referring now to FIG. 2, shown is an example layout plan of pads and solder balls of a power device in accordance with embodiments of the present invention. Pairs of pads with solder balls thereon can be formed on die 201. For example, pads 203 may be source pads, and solder balls (clear circles) on the source pads can be source solder balls 202. Pads 205 may be drain pads, and solder balls (solid circles) on the drain pads may be drain solder balls 204. Here, solder balls 202 and solder balls 204 can be arranged in a matrix array.

Figure 3:
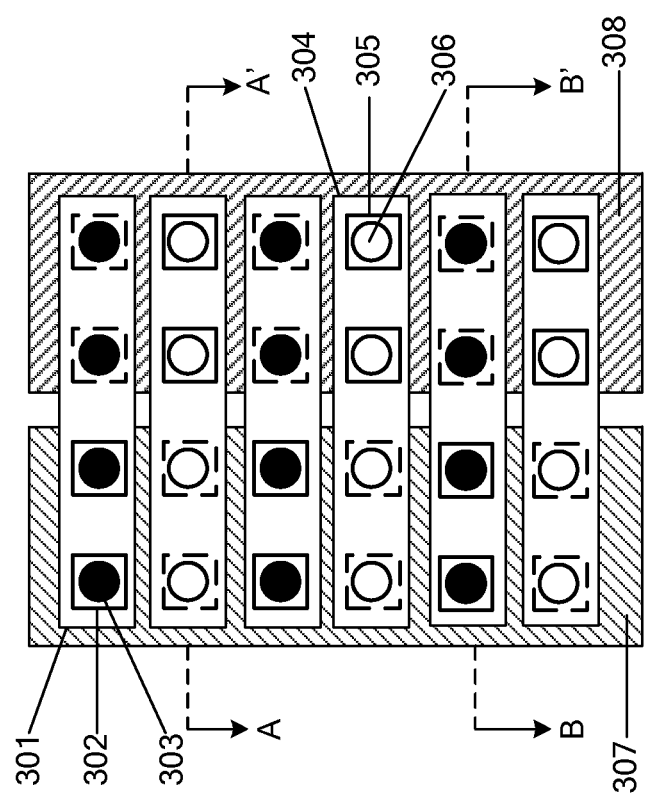
FIG. 3 shows an example layout plan of an RDL and a lead frame of a flip-chip package structure of the power device die of FIG. 2, in accordance with embodiments of the present invention.

Referring now to FIG. 3, shown is an example layout plan of a redistribution layer and lead frame of the flip-chip package structure of the die of FIG. 2, in accordance with embodiments of the present invention. Redistribution layer can include pairs of drain redistribution layer 301 and source redistribution layer 304. In this example matrix array arrangement of solder balls 204, a first surface of drain redistribution layer 301 can overlap drain solder balls 204, and the drain electrode may be introduced via the left half region of drain redistribution layer 301 through pads 302 and solder balls 303 on a second surface of drain redistribution layer 301. The first surface of source redistribution layer 304 can overlap source solder balls 202, and the source electrode can be introduced via the right half region of redistribution layer 304 through pads 305 and solder balls 306 on a second surface of source redistribution layer 304.

In this way, the drain and source electrodes can be arranged in separate and non-overlapping regions. Each pin of the lead frame may have a different electrical polarity (e.g., drain or source polarity) by employing a first surface of a pin to overlap solder balls with a same polarity. As used herein, "polarity" can mean an electrical polarity of a current conducting path based on positive and negative terminals, a drain/source polarity as to a current flow direction in a MOS transistor, and/or an input/output/ground polarity based on power device configurations. In FIG. 3, the first surface of pin 307 can overlap solder balls 303 with a drain polarity, while the first surface of pin 308 can overlap solder balls 306 with a source polarity. The lead frame can be connected to the metal layers of a PCB (e.g., Cu layers) to achieve electrical connectivity between the drain and source as shown to external circuitry.

Figure 4A:
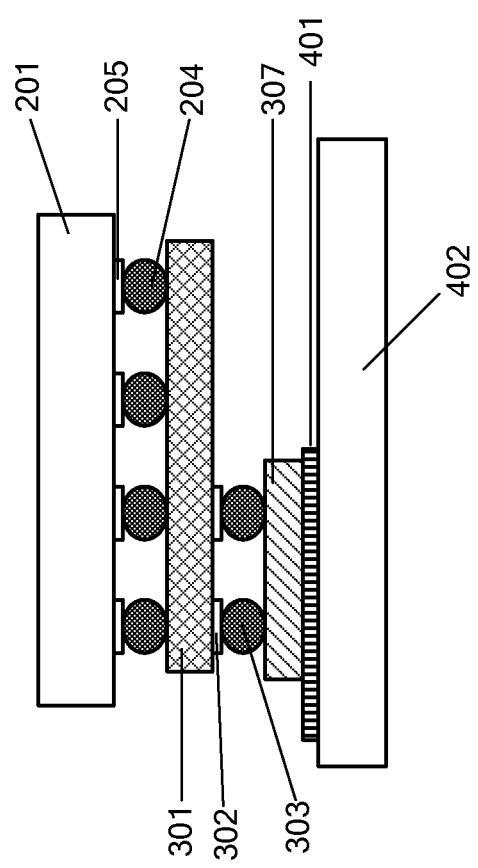
FIG. 4A shows a sectional view of an example flip-chip package structure of the power device die of FIG. 3 along axis B-B', in accordance with embodiments of the present invention.

Referring now to FIG. 4A, shown is a sectional view along the axis B-B' of the flip-chip package structure of the power device die shown in FIG. 3, in accordance with embodiments of the present invention. Die 201 (e.g., a power device) can be upended or flipped over, and pads 205 and solder balls 204 on the first surface of die 201 can be connected to the first surface of redistribution layer 301. Pads 302 and solder balls 303 on the second surface of redistribution layer 301 can connect to the first surface of pin 307 of the lead frame. Also, the second surface of pin 307 can be connected to metal layer 401 of PCB 402.

Instead of the drain polarity being dispersed in an entire region of die 201, the drain polarity in this example can be concentrated in a left region of die 201 through redistribution layer 301. Redistribution layer 301 can accommodate metal layer 401 of PCB 402, and pin 307 of the lead frame as shown. In addition to electrical connectivity being formed between die 201 and external circuitry, the resistance of current conducting paths can be decreased to reduce power losses and improve efficiency of the switching power supply.

Figure 4B:
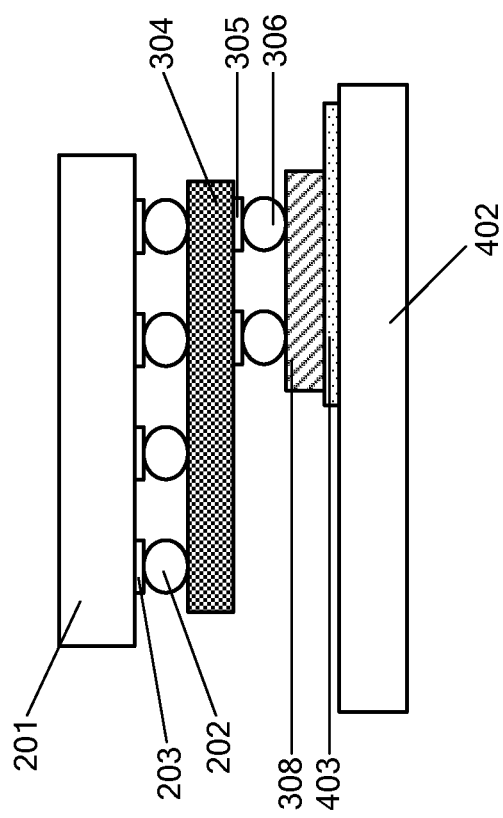
FIG. 4B shows a sectional view of an example flip-chip package structure of the power device die of FIG. 3 along axis A-A', in accordance with embodiments of the present invention.

Referring now to FIG. 4B, shown is a sectional view along the axis A-A' of the flip-chip package structure of the power device die of FIG. 3, in accordance with embodiments of the present invention. Die 201 (e.g., a power device) can be flipped, and pads 203 and solder balls 202 on the first surface of die 201 can be connected to the first surface of redistribution layer 304. Pads 305 and solder balls 306 on the second surface of redistribution layer 304 can be connected to the first surface of pin 308 of the lead frame. Also, the second surface of pin 308 can connect to metal layer 403 of PCB 402.

Instead of the drain polarity being dispersed in an entire region of die 201, the drain polarity in this example can be concentrated in a right region of die 201 through redistribution layer 304, which can accommodate metal layer 403 of PCB 402 and pin 308 of the lead frame. In addition to electrical conductivity being formed between die 201 and external circuitry, the resistance of current conducting paths can be decreased to reduce power losses and improve efficiency of the switching power supply. In addition, the size of the flip-chip package structure can be adjusted proportionally in consideration that the region occupied by the power device can be expanded or contracted by modulating the area of the power device which.

In particular embodiments, any suitable transistors can be employed as the power device, such as LDMOS transistors. In addition, any suitable material (e.g., a Cu alloy) can be utilized for the lead frame. The flip-chip package structure can also be any one of (quad flat no-lead (QFN) package, dual flat no-lead (DFN) package, or any other suitable package structure. Also, the bumps employed to form connections between the redistribution layer and the die, and connections between the redistribution layer and the lead frame, can be any suitable formations or structures (e.g., copper pillar bump, tin, electroless nickel immersion gold [ENIG], etc.).

In example monolithic integration of a switching power supply, power devices $M_1$ and $M_2$, and control and driving circuit 103 can be integrated into a single die. Parasitic resistances and/or inductances may be decreased by avoiding use of bonding wires among or between the control and driving circuit, and the power devices. In the examples herein, the bumps employed to form connections between the redistribution layer and the die, and connections between the redistribution layer and the lead frame, may be pads with solder balls thereon.

Figure 5:
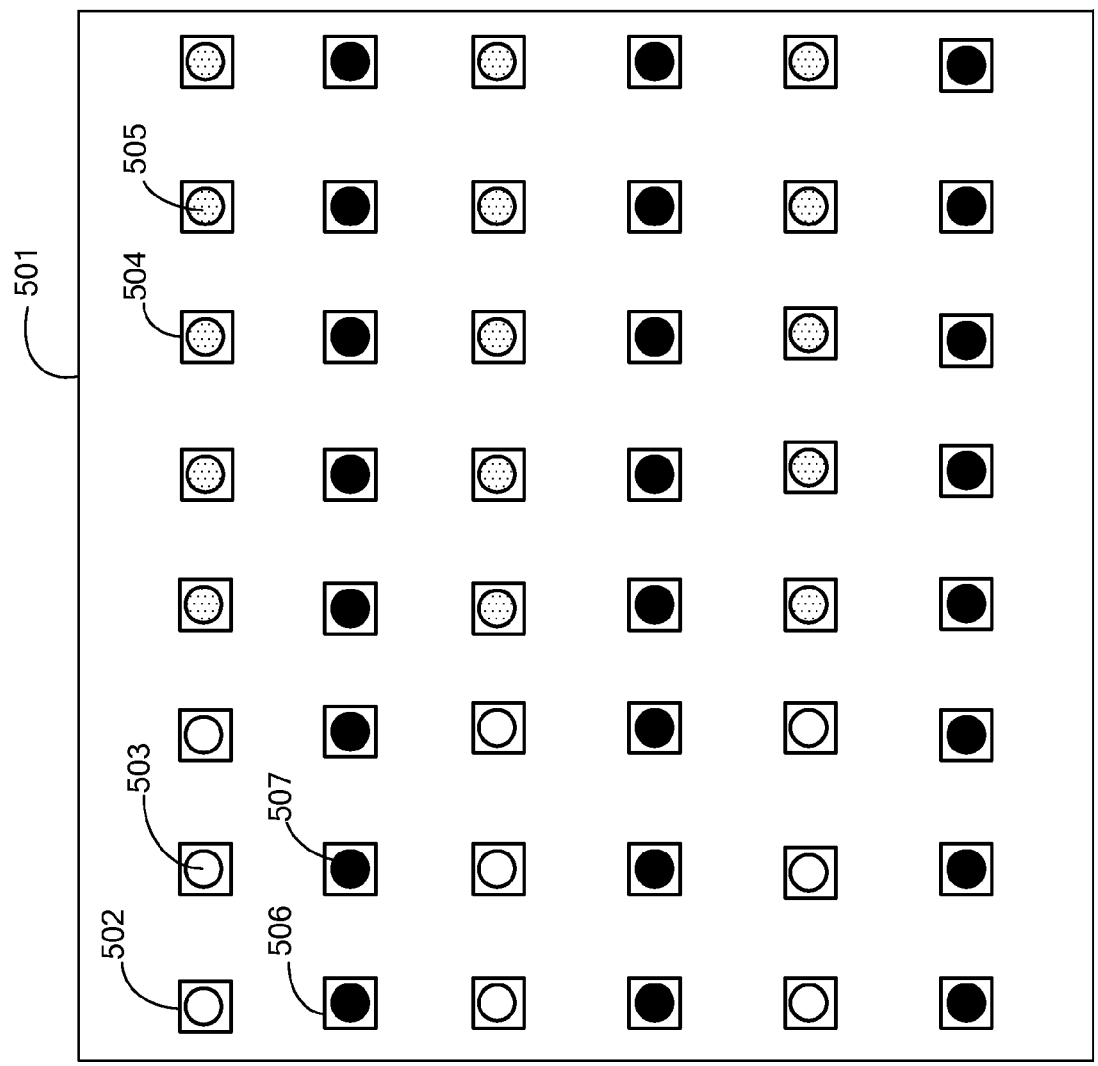
FIG. 5 shows an example layout plan of pads and solder balls on a power device die, in accordance with embodiments of the present invention.

Referring now to FIG. 5, shown is an example layout plan of pads and solder balls on a die of a monolithic switching power supply, in accordance with another embodiment of the present invention. In this example, die 501 can include two power devices that are in a parallel arrangement, along with a control and driving circuit. Here, only the layout of pads and solder balls of the power devices are shown to facilitate the description. Pads and solder balls can be arranged in a matrix array on the first surface of die 501. A first kind of rows can include input pads 502 and input solder balls 503 thereon, as well as ground pads 504 and ground solder balls 505 thereon. A second kind of rows can include output pads 506 and output solder balls 507 thereon. As shown, the first kind of rows and the second kind rows may be separated from each other.

Figure 6:
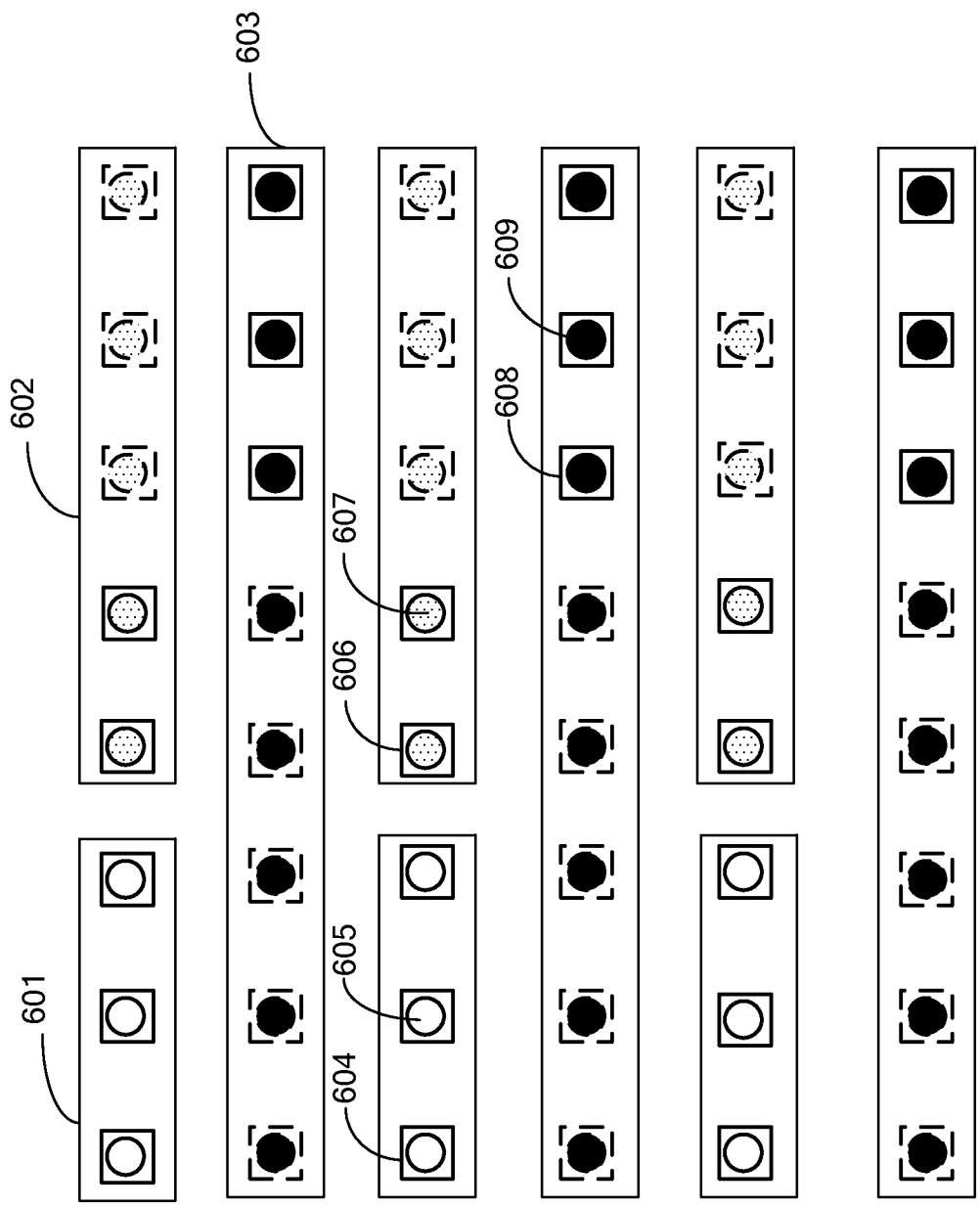
FIG. 6 shows an example layout plan of an RDL of the flip-chip package structure of a monolithic switching power supply die of FIG. 5, in accordance with embodiments of the present invention.

Referring now to FIG. 6, shown is an example layout plan of a redistribution layer in the flip-chip package structure of the monolithic switching power supply of FIG. 5, in accordance with embodiments of the present invention. Input solder balls 503, output solder balls 507, and ground solder balls 505 may be redistributed through various redistribution layer units of the redistribution layer. A first surface of the redistribution layer can be connected to corresponding input solder balls, output solder balls, and ground solder balls. Also, the pads and solder balls on a second surface of the redistribution layer can be configured to redistribute the input polarity, output polarity, and ground polarity of die 501. This redistribution can facilitate pin arrangement to achieve a maximized reduction of resistance of a current conducting path.

For example, the first surface of redistribution layer unit 601 can overlap input solder balls 503, and pads 604 and solder balls 605 on the second surface of redistribution layer unit 601 can be configured such that a left region of the die has the input polarity. Similarly, the first surface of redistribution layer unit 602 can overlap ground solder balls 505, and pads 606 and solder balls 607 on the second surface of redistribution layer unit 602 can be configured to make a middle region of the die have the ground polarity. Also, the first surface of redistribution layer unit 603 can overlap output solder balls 507, and pads 608 and solder balls 609 on the second surface of redistribution layer unit 603 can be configured to make a right region of the die have the output polarity.

Figure 7:
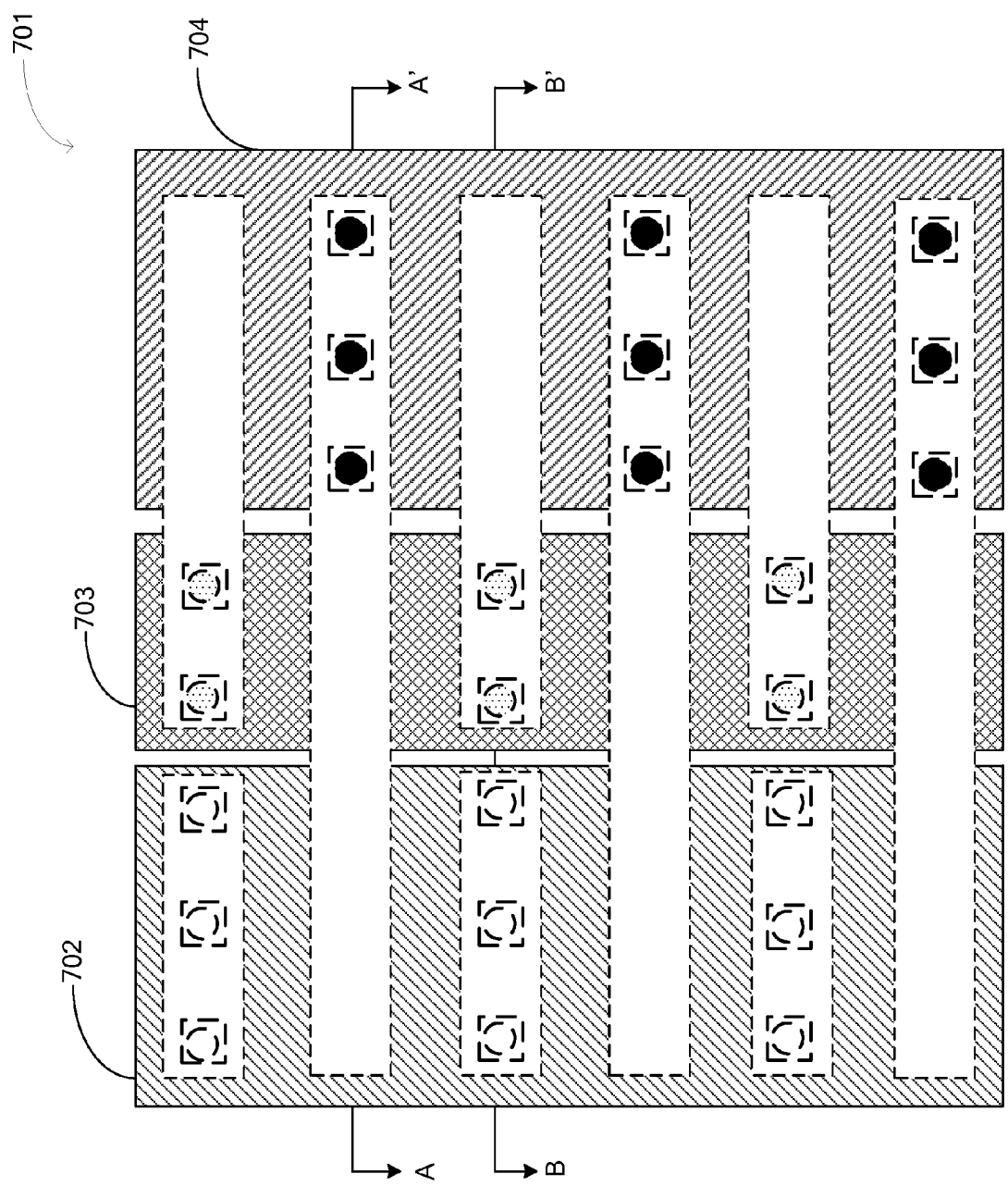
FIG. 7 shows an example layout plan of a lead frame of a flip-chip package structure of a monolithic switching power supply die as shown in FIG. 5, in accordance with embodiments of the present invention.

Referring now to FIG. 7, shown is an example layout plan of a lead frame in a flip-chip package structure of the monolithic switching power supply of FIG. 5, in accordance with embodiments of the present invention. As shown in FIG. 6, the polarity may be redistributed through a redistribution layer that includes various redistribution layer units or portions. For example, the input polarity can be arranged in a left region, the ground polarity can be arranged in a middle region, and the output polarity can be arranged in a right region. Input pin 702, output pin 704, and ground pin 703 of the lead frame can be configured as three full metal layers. For example, the pins can be configured as a copper layer. In this way, improved mechanical support can be achieved for both the die and the redistribution layer, and also reduced resistance can be achieved for the pins as part of the current conduction path.

Figure 8A:
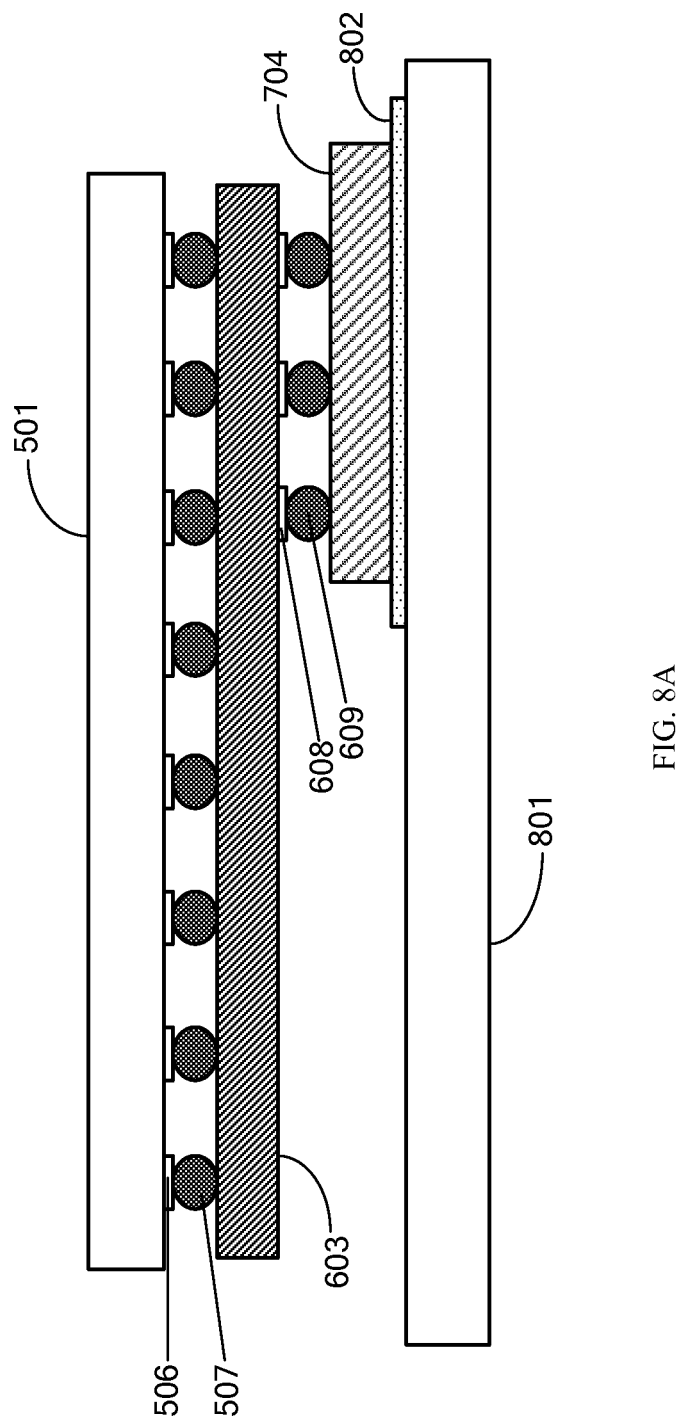
FIG. 8A shows a sectional view of an example flip-chip package structure of a monolithic switching power supply die as shown in FIG. 7 along axis A-A', in accordance with embodiments of the present invention.

Referring now to FIG. 8A, shown is an example sectional view along axis A-A' of a flip-chip package structure for the monolithic switching power supply of FIG. 7, in accordance with embodiments of the present invention. Here, die 501 can be flipped or upended, and output pads 506 and output solder balls 507 thereon can be on the first surface of redistribution layer unit 603. Pads 608 and solder balls 609 on the second surface of redistribution layer unit 603 can be connected to the first surface of pin 704 of the lead frame. In addition, the second surface of pin 704 can connect to metal layer 802 of PCB 801.

Figure 8B:
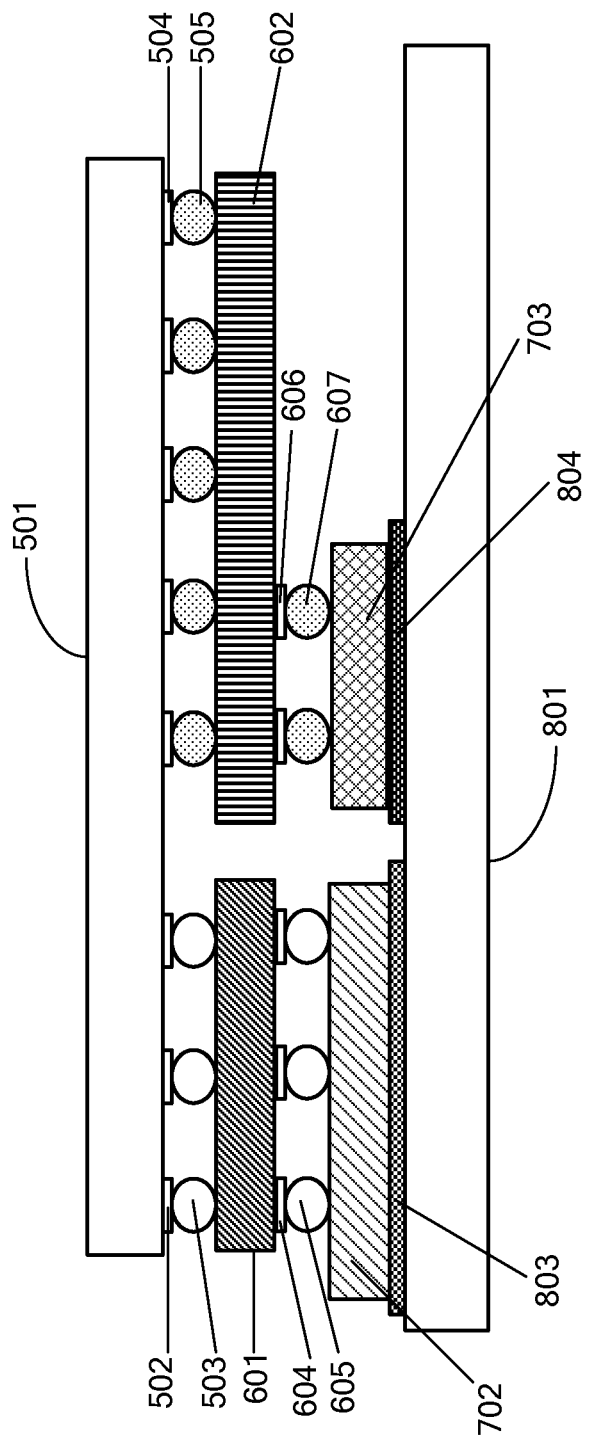
FIG. 8B shows a sectional view of an example flip-chip package structure of a monolithic switching power supply die as shown in FIG. 7 along axis B-B', in accordance with embodiments of the present invention.

Referring now to FIG. 8B, shown is an example sectional view along axis B-B' of a flip-chip package structure for the monolithic switching power supply of FIG. 7, in accordance with embodiments of the present invention. Here, die 501 can be flipped or upended, and input pads 502 and output solder balls 503 thereon can be connected to the first surface of redistribution layer unit 601. Pads 604 and solder balls 605 on the second surface of redistribution layer unit 601 can be connected to the first surface of pin 702 of the lead frame. Also, the second surface of pin 702 can connect to metal layer 803 of PCB 801. Ground pads 504 and ground solder balls 505 on die 501 can connect to the first surface of redistribution layer unit 602. Pads 606 and solder balls 607 on the second surface of redistribution layer unit 602 can connect to the first surface of pin 703 of the lead frame. Also, the second surface of pin 703 can be connected to metal layer 804 of PCB 801.

In particular embodiments, a flip-chip package structure of a monolithic switching power supply can include redistribution of different polarities to be more concentrated in order to facilitate arrangement of both pins and metal layers on a PCB through corresponding redistribution layers. Further, metal layers with relatively large sizes and/or thicknesses can be configured as pins and metal layers on a PCB in order to reduce the resistance of a current conducting path, and to improve conduction efficiency of the conduction path. In addition, the power device region of a switching power supply can be expanded or contracted by adjusting the area of the power devices, which can simplify the design of a series of products and packaging processes to enhance versatility for power devices with variable rated currents. Also, any other suitable layout structure can be applied to a flip-chip package structure in certain embodiments.

Figure 9:
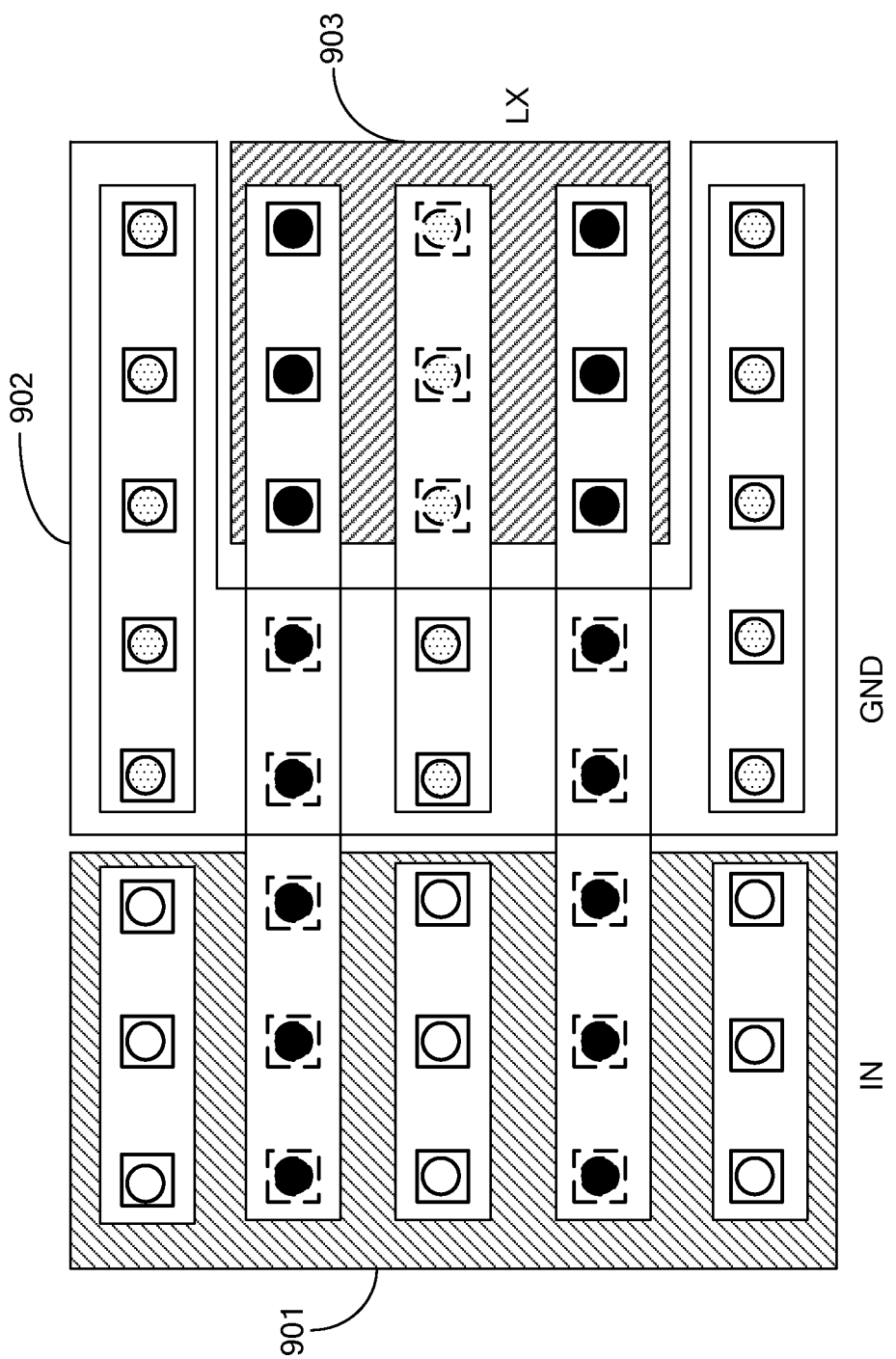
FIG. 9 is a diagram of an example flip-chip package structure of a monolithic switching power supply die, in accordance with embodiments of the present invention.

Referring now to FIG. 9, shown is an example layout of a flip-chip package structure for a monolithic switching power supply, in accordance with embodiments of the present invention. In this example, three polarities (IN, GND, and LX) may be redistributed via a redistribution layer, and electrical conductivity can be implemented by pins of the lead frame. Here, pin 902 is shaped not like a regular rectangular shape, but as a different suitable shape according to the structure of the redistribution layer. The regions of the three pins (input pin 901, ground pin 902, and output pin 903) may not mutually overlap, and can be form an "E" shape.

Figure 10:
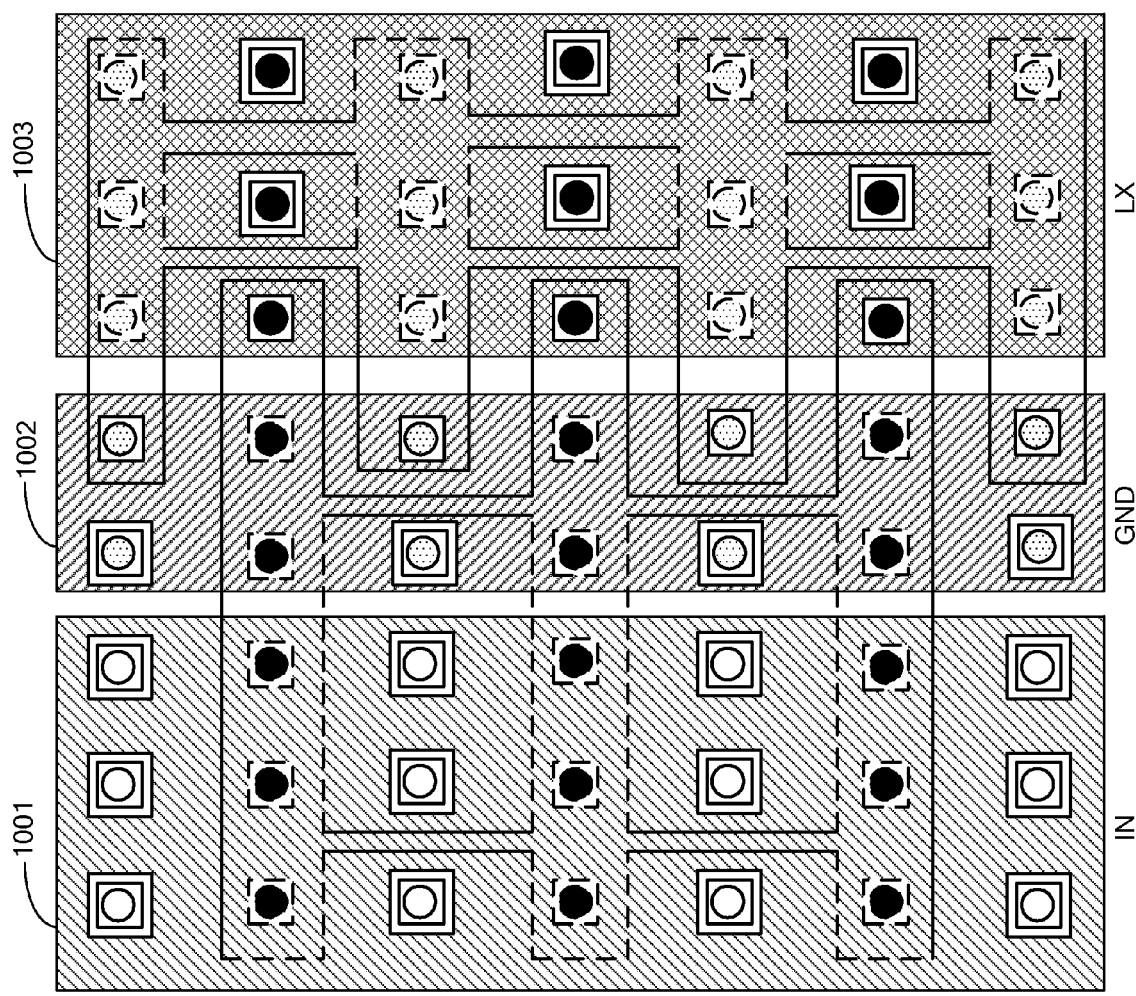
FIG. 10 is a diagram of an example flip-chip package structure of a monolithic switching power supply die, in accordance with embodiments of the present invention.

Referring now to FIG. 10, shown is an example layout of a flip-chip package structure for a monolithic switching power supply, in accordance with embodiments of the present invention. In this particular example, the redistribution layer units can overlap by one single pad and solder ball thereon, or may overlap the solder balls with a same polarity in different rows or columns across rows or columns, to transfer a given polarity to a different region. For example, input pin 1001 (IN) can be arranged in a left region, ground pin 1002 (GND) can be arranged in a middle region, and output pin 1003 (LX) can be arranged in a right region.

In one embodiment, a flip-chip packaging method can include: (i) providing a die having an integrated switching power supply thereon, where a first surface of the die includes a plurality of first bumps having at least two polarities; (ii) laying a redistribution layer including a plurality of redistribution layer units on the die, where a first surface of the redistribution layer units is configured to connect bumps with a same polarity from among the plurality of first bumps, and where a second surface of the redistribution layer units comprises a plurality of second bumps configured to redistribute polarities; (iii) laying a lead frame having a plurality of pins on the redistribution layer, where a first surface of the lead frame is configured to connect to bumps having a same polarity from among the plurality of second bumps; and (iv) packaging the die, the pluralities of first and second bumps, and the lead frame into a flip-chip package structure, where a second surface of the lead frame is configured to provide electrical connectivity between the integrated switching power supply and a PCB.

Figure 11:
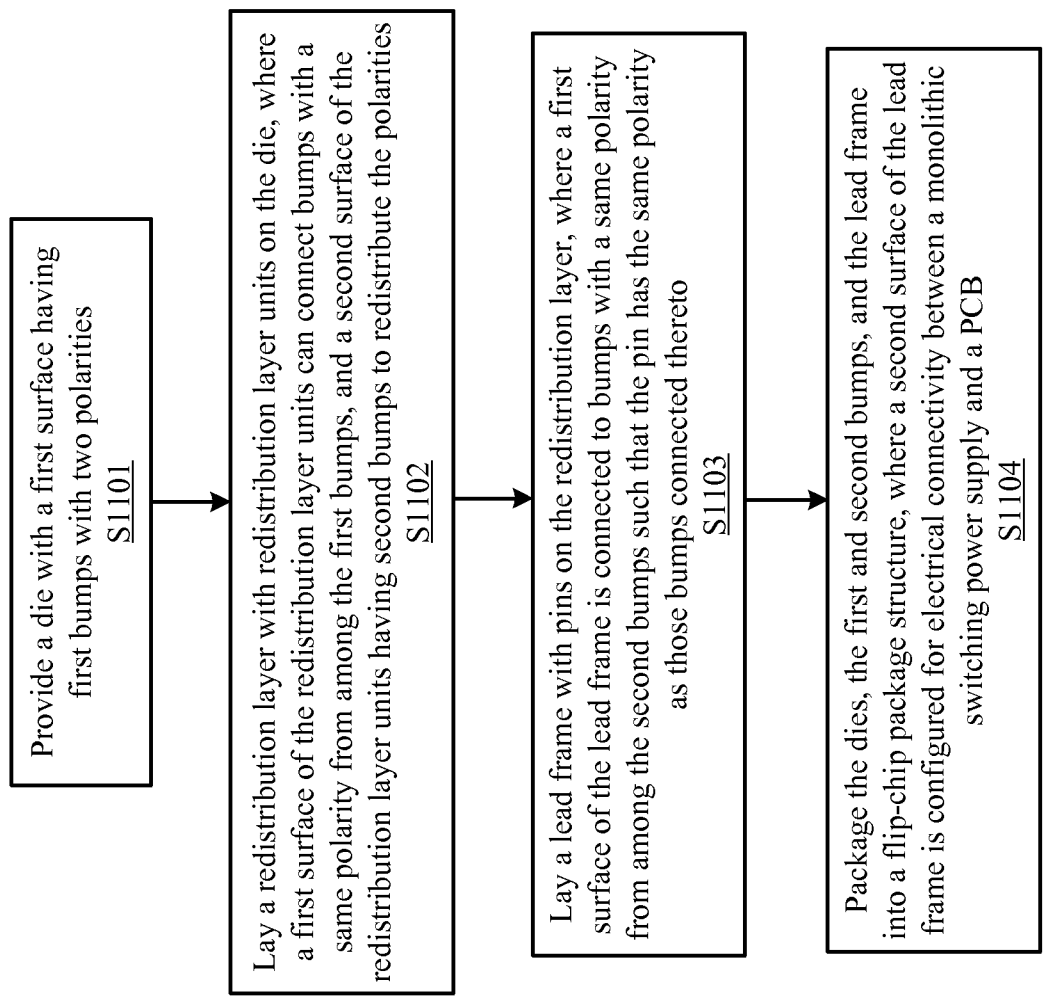
FIG. 11 is a flow diagram, of an example flip-chip package method for an integrated switching power supply, in accordance with one embodiment of the present invention.

Referring now to FIG. 11, shown is a flow diagram of an example flip-chip packaging method for a monolithic switching power supply, in accordance with embodiments of the present invention. At S1101, a die (or one or more dies) can be provided, where first bumps with at least two polarities can be arranged on the on a on a first surface of the die. At S1102, a redistribution layer can be placed on the die. The redistribution layer can include redistribution layer units, where a first surface of a redistribution layer unit can be configured to connect bumps with a same polarity from among the first bumps. Also, a second surface of a redistribution layer unit can include second bumps to redistribute the polarities.

At S1103, a lead frame can be provided on the redistribution layer. The lead frame can include pins with a first surface that can be connected to the bumps with a same polarity from among second bumps to a pin that has the same polarity. At S1104, the dies, the first and second bumps, and the lead frame can be packaged into a flip-chip package structure. A second surface of the lead frame can be configured to achieve electrical conductivity between the monolithic switching power supply and a PCB.

Furthermore, the first bumps can be arranged in a regular matrix array. At S1102, according to the rows or columns of the matrix array, the bumps with a same polarity from among the first bumps in the same row or column can be connected by the first surface of the redistribution layer unit in a rectangular shape. Across the rows or columns, bumps with the same polarity of the first bumps in a different row or column can also be connected by the first surface of the redistribution layer unit, which can be shaped like a regular geometrical shape.

The second bumps on the second surface of the redistribution layer can also have a same polarity as the first bumps. Bumps with a same plurality among the second bumps may be concentrated into a region by the arrangement of the second bumps. For example, each group of bumps with the same polarity from among the second bumps can be arranged in parallel and separated from each other along one boundary of the region of die, or can be arranged without mutual overlap and separated from each other to facilitate layout of pins of the lead frame.

At S1103, the first surface of pins of the lead frame can overlap the bumps with a same polarity from among the second bumps to form electrical conductivity between the given polarity and external circuitry by the pins. The regions of the bumps with a same polarity from among the second bumps can be more concentrated by the polarity redistribution of the redistribution layer to facilitate the arrangement of pins. Metal layers with relatively large sizes and/or thicknesses can be configured as pins to reduce the resistance of a current conducting path, and to reduce power losses. A conducting path to conduct relatively large current may include input pins, output pins, and/or ground pins for a switching power supply.

At S1104, different metal layers can be arranged on a PCB to connect the second surface of different pins of the lead frame. Correspondingly, the metal layers can be configured to be relatively large or thick to reduce the resistance of the metal layer. Other suitable structures, layouts, and/or elements can be applied to the particular examples described herein, such as the types of power devices, materials of the lead frame, types of the flip-chip package structures, and formation of bumps.

The embodiments were chosen and described in order to best explain the principles of the invention and its practical applications, to thereby enable others skilled in the art to best utilize the invention and various embodiments with modifications as are suited to the particular use contemplated. It is intended that the scope of the invention be defined by the claims appended hereto and their equivalents.

What is claimed is:

1. A flip-chip package structure, comprising:
    a) a die having an integrated switching power supply thereon, wherein a first surface of said die comprises a plurality of first bumps having at least two polarities;
    b) a redistribution layer comprising a plurality of redistribution layer units, each redistribution layer unit having a first surface configured to connect bumps with a same polarity from among said plurality of first bumps, said redistribution layer having a second surface comprising a plurality of second bumps configured to redistribute polarities;
    c) a lead frame having a plurality of pins, wherein a first surface of said lead frame is configured to connect bumps with a same polarity from among said plurality of second bumps; and
    d) a flip-chip package configured to package said die, said redistribution layer, said pluralities of first and second bumps, and said lead frame, wherein a second surface of said lead frame is configured to provide electrical connectivity between said integrated switching power supply and a printed-circuit board (PCB).

2. The flip-chip package structure of claim 1, wherein said plurality of first bumps are arranged in a matrix array.

3. The flip-chip package structure of claim 2, wherein said redistribution layer unit comprises a rectangular shape configured to connect said same polarity bumps from among said plurality of first bumps in accordance with rows or columns of said matrix array.

4. The flip-chip package structure of claim 2, wherein at least one redistribution layer unit is configured to connect said same polarity bumps from among said plurality of first bumps in different rows or columns.

5. The flip-chip package structure of claim 1, wherein each said polarity is concentrated through said redistribution layer into a corresponding different region occupied by said die.

6. The flip-chip package structure of claim 1, wherein said die comprises first and second power devices.

7. The flip-chip package structure of claim 6, wherein each of said power devices comprises a laterally diffused metal oxide semiconductor (LDMOS) transistor.

8. The flip-chip package structure of claim 1, further comprising a plurality of dies, wherein said integrated switching power supply comprises at least one discrete die having a power device.

9. The flip-chip package structure of claim 1, wherein said flip-chip package is configured as a quad flat no lead (QFN) package structure.

10. The flip-chip package structure of claim 1, wherein said flip-chip package is configured as a dual flat no lead (DFN) package structure.

11. The flip-chip package structure of claim 1, wherein said pins overlap at least a portion of said same polarity bumps from among said plurality of second bumps.

12. The flip-chip package structure of claim 1, wherein said pins with a corresponding polarity are arranged in parallel and separated from each other.

13. The flip-chip package structure of claim 1, wherein said pins comprise at least one of: a rectangular shape, an arch shape, and an "E" shape.

14. A flip-chip packaging method, comprising:
    a) providing a die having an integrated switching power supply thereon, wherein a first surface of said die comprises a plurality of first bumps having at least two polarities;
    b) laying a redistribution layer comprising a plurality of redistribution layer units on said die, wherein a first surface of said redistribution layer units is configured to connect bumps with a same polarity from among said plurality of first bumps, and wherein a second surface of said redistribution layer units comprises a plurality of second bumps configured to redistribute polarities;

c) laying a lead frame having a plurality of pins on said redistribution layer, wherein a first surface of said lead frame is configured to connect to bumps having a same polarity from among said plurality of second bumps; and d) packaging said die, said pluralities of first and second bumps, and said lead frame into a flip-chip package structure, wherein a second surface of said lead frame is configured to provide electrical connectivity between said integrated switching power supply and a printed-circuit board (PCB).

15. The method of claim 14, wherein said plurality of first bumps are arranged in a matrix array.

16. The method of claim 15, wherein said redistribution layer unit comprises a rectangular shape configured to connect said same polarity bumps from among said plurality of first bumps in accordance with rows or columns of said matrix array.

17. The method of claim 15, wherein at least one redistribution layer unit is configured to connect said same polarity bumps from among said plurality of first bumps in different rows or columns.

18. The method of claim 14, wherein each said polarity is concentrated through said redistribution layer into a corresponding different region occupied by said die.

19. The method of claim 14, wherein said PCB comprises a plurality of metal layers configured to connect to said second surface of said pins.

* * * * *